United States Patent
Lu et al.

(10) Patent No.: US 12,369,238 B2
(45) Date of Patent: Jul. 22, 2025

(54) LED DRIVER ELECTROMAGNETIC INTERFERENCE MITIGATION

(71) Applicant: Avago Technologies International Sales Pte. Limited, Singapore (SG)

(72) Inventors: Junjie Lu, Irvine, CA (US); Jingbo Duan, Irvine, CA (US); Jing Guo, Irvine, CA (US); Jianhua Gan, Irvine, CA (US); Jungwoo Song, Irvine, CA (US); Xicheng Jiang, Irvine, CA (US)

(73) Assignee: Avago Technologies International Sales Pte. Limited, Palo Alto, CA (US)

( * ) Notice: Subject to any disclaimer, the term of this patent is extended or adjusted under 35 U.S.C. 154(b) by 56 days.

(21) Appl. No.: 18/162,027

(22) Filed: Jan. 31, 2023

(65) Prior Publication Data
US 2024/0260154 A1    Aug. 1, 2024

(51) Int. Cl.
*H05B 45/30* (2020.01)
*H05B 45/345* (2020.01)
*H05B 45/36* (2020.01)
*H05B 45/37* (2020.01)

(52) U.S. Cl.
CPC ........... *H05B 45/36* (2020.01); *H05B 45/345* (2020.01); *H05B 45/37* (2020.01)

(58) Field of Classification Search
CPC ...... H05B 45/30; H05B 45/345; H05B 45/36; H05B 45/37; H05B 47/10; H05B 47/16; H03M 1/66; H03K 5/135
See application file for complete search history.

(56) References Cited

U.S. PATENT DOCUMENTS

| | | | |
|---|---|---|---|
| 9,287,823 B1 | 3/2016 | Holzmann | |
| 9,548,647 B2 | 1/2017 | Cortigiani et al. | |
| 9,949,326 B2 | 4/2018 | Elo et al. | |
| 2009/0174338 A1 | 7/2009 | Muramatsu | |
| 2013/0300465 A1 | 11/2013 | Su et al. | |
| 2016/0380595 A1 | 12/2016 | Finlinson et al. | |
| 2019/0372579 A1* | 12/2019 | La Rosa | H03M 1/02 |
| 2022/0329252 A1* | 10/2022 | Oreggia | H03M 1/1076 |

FOREIGN PATENT DOCUMENTS

| | | | | |
|---|---|---|---|---|
| CN | 104821822 A | * | 8/2015 | ........... G09G 3/3208 |
| EP | 3146799 B1 | | 11/2020 | |

OTHER PUBLICATIONS

Chou, F. et al., A 10-Bit 250MS/s Low-Glitch Binary-Weighted Digital-to-Analog Converter, In 2014 27th IEEE International System-on-Chip Conference (SOCC), 2014, pp. 231-235.

European Patent Office, Partial Search Report, Application No. 24154628.2, Jul. 3, 2024, 20 pages.

* cited by examiner

*Primary Examiner* — Jimmy T Vu
(74) *Attorney, Agent, or Firm* — Quarles & Brady LLP

(57) ABSTRACT

An apparatus includes a digital ramp generator comprising a delay line, the delay line comprising one or more delay elements and an oscillator, wherein the digital ramp generator is configured to generate a code based on respective outputs of the one or more delay elements, a digital to analog converter coupled to the digital ramp generator, wherein the digital to analog converter is configured to generate a reference signal, wherein the reference signal is generated based, at least in part, on the code, and a driver coupled to the digital to analog converter, the driver configured to generate a drive current based, at least in part, on the reference signal.

19 Claims, 5 Drawing Sheets

LED DRIVER ELECTROMAGNETIC INTERFERENCE MITIGATION

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for performance and reliability in circuits, including driver circuits.

BACKGROUND

In a typical optical sensing system, a light-emitting diode (LED) or laser driver may be used to drive an external LED or laser diode (e.g., a vertical cavity surface-emitting laser (VCSEL)). Fast current edge transitions in the LED or laser driver can cause electromagnetic interference (EMI), which can disrupt the operation of photo sensing amplifiers, data acquisition, and other circuits in the optical sensing system.

Thus, methods, systems, and apparatuses for mitigating EMI from the LED driver are provided.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
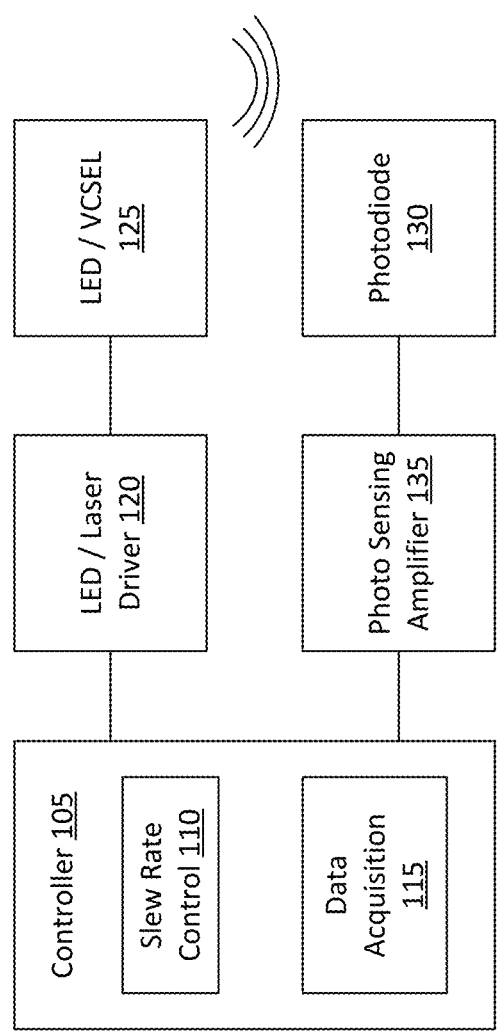
FIG. 1 is a schematic block diagram of a system for LED and laser driver EMI mitigation, in accordance with various embodiments.

Various embodiments set forth systems, methods, and apparatuses for EMI mitigation in LED and laser drivers.

In some embodiments, an apparatus for LED and laser driver EMI mitigation is provided. An apparatus includes a digital ramp generator comprising a delay line, the delay line comprising one or more delay elements and an oscillator, wherein the digital ramp generator is configured to generate a code based on respective outputs of the one or more delay elements, a digital to analog converter coupled to the digital ramp generator, wherein the digital to analog converter is configured to generate a reference signal, wherein the reference signal is generated based, at least in part, on the code, and a driver coupled to the digital to analog converter, the driver configured to generate a drive current based, at least in part, on the reference signal.

In further embodiments, a circuit for LED and laser driver EMI mitigation is provided. The circuit includes one or more delay elements, each delay element of the one or more delay elements clocked via a clock signal, wherein a first delay element of the one or more delay elements is configured to receive a control signal as input, and wherein a second delay element of the one or more delay elements is configured to output a delayed control signal, the control signal comprising a first rising edge, the delayed control signal comprising a second rising edge, the second rising edge being later than the first rising edge. The circuit further includes an oscillator configured to generate the clock signal, wherein the oscillator is configured to generate the clock signal in response to an enable signal, and an exclusive or (XOR) gate configured to output the enable signal, wherein a first input of the XOR gate is coupled to the control signal, and a second input of the XOR gate is coupled to the delayed control signal, wherein the enable signal is generated by a XOR of the first and second inputs. The circuit further includes a selector coupled to the one or more delay elements, the selector configured to provide a code based on the outputs of the one or more delay elements.

In further embodiments, a system for LED and laser driver EMI mitigation is provided. The system includes a controller configured to generate a control signal, and a circuit coupled to the controller. The circuit includes one or more delay elements, each delay element of the one or more delay elements clocked via a clock signal, wherein a first delay element of the one or more delay elements is configured to receive the control signal as input, and wherein a second delay element of the one or more delay elements is configured to output a delayed control signal, the control signal comprising a first rising edge, the delay control signal comprising a second rising edge, the second rising edge being later than the first rising edge. The circuit further includes an oscillator configured to generate the clock signal, wherein the oscillator is configured to generate the clock signal in response to an enable signal, and a selector coupled to the one or more delay elements, the selector configured to generate a code based on outputs of the one or more delay elements. The circuit further includes a digital to analog converter (DAC) coupled to the selector, wherein the DAC is configured to generate a reference signal based, at least in part, on the code. The system may further include a driver coupled to the circuit, the driver configured to generate a drive current based, at least in part, on the reference signal, and a light emitting diode coupled to the driver, the light emitting diode configured to generate an optical signal based on the drive current.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

Previous approaches to mitigating EMI from a LED or laser driver have included a free-running clock based slew rate control scheme and delay line based slew rate control. When utilizing an internal free-running clock, the externally generated pulse control signal (TX_PU) is asynchronous to the internal free-running clock. As such, variability is introduced to the transmit (TX) output current phase and pulse width, which further degrades signal-to-noise ratio (SNR) performance. Moreover, the internal free-running clock may also cause electromagnetic compatibility issues and issues with noise coupling to output current. With regard to the delay line based slew rate control, analog delay elements often take up a large footprint with large numbers of elements. Moreover, the delay elements are sensitive to supply noise, and utilize large capacitors to reduce the impacts of noise.

Accordingly, a slew rate control architecture is set forth below that utilizes a digital delay line that includes one or more digital delay elements (e.g., flip-flops) and a relaxation oscillator design. The slew rate control architecture associates the phase of the clock signal from the oscillator to TX_PU (e.g., the pulse control signal). Specifically, the clock signal is generated in response to assertion (e.g., a logic level indicating that the signal is active or otherwise enabled, such as a logic high) of the TX_PU signal. Thus, in various examples, active, asserted, and enabled may be used interchangeably. Similarly, inactive, "not asserted," and disabled may be used interchangeably. Moreover, by utilizing a digital flip flop in place of analog delay elements, the footprint of the slew rate control architecture is reduced.

FIG. 1 is a schematic block diagram of a system 100 for LED and laser driver EMI mitigation, in accordance with various embodiments. The system 100 includes a controller 105, slew rate control logic 110, data acquisition logic 115, LED/laser driver 120, LED/VCSEL 125, photodiode 130, and photo sensing amplifier 135. It should be noted that the various components of system 100 are schematically illustrated in FIG. 1, and that modifications to the various components and other arrangements of system 100 may be possible and in accordance with the various embodiments.

In various embodiments, the controller 105 may include slew rate control logic 110 and data acquisition logic 115. In various examples, the controller 105 may be implemented in hardware, software, and/or a combination of hardware and software. Specifically, the controller 105, slew rate control logic 110, and/or data acquisition logic 115 may include, without limitation, software (including firmware), circuit (including logical circuits), custom integrated circuit (ICs), system on a chip (SoC), or programmable logic (such as field-programmable gate array (FPGA)) implementations. In other examples, slew rate control logic 110, and/or data acquisition logic 115 may be implemented as part of the firmware of the controller 105. In other arrangements, it is to be understood that certain logic, such as the slew rate control logic 110, may be implemented as part of other components. For example, in some embodiments, the slew rate control logic 110 may be implemented as part of the LED/laser driver 120.

In various examples, the controller 105 may be configured to generate a pulse control, or TX_PU, signal. The controller 105 may cause, via TX_PU signal, the LED/laser driver 120 to drive a current pulse (ITX) (e.g., a drive current) through the LED/VCSEL 125. Thus, ITX may be a drive current configured to drive the LED/VCSEL 125. A drive current is the current supplied by the driver to power or otherwise activate the LED/VCSEL 125. Thus, in various embodiments, TX_PU is a signal asserted (e.g., set to a logic level indicating that the signal is active or otherwise enabled, such as a logic high) by the controller 105 to enable the LED/laser driver 120 (e.g., cause the LED/laser driver to generate ITX). As previously described, the slew rate of ITX may be controlled to mitigate EMI generated by the LED/laser driver 120. Slew rate refers to the rate in which the level of the output signal (e.g., drive current of ITX or other output signal) increases or decreases.

In various examples, the LED/laser driver 120 may include a circuit or IC configured to supply power to the LED/VCSEL 125. The LED/laser driver 120, for example, may include various types of line drivers, such as a constant current or constant voltage driver. Accordingly, the LED/laser driver 120 may be configured to provide a voltage and/or current regulated output signal to power the LED/VCSEL 125. In some examples, the LED/laser driver 120 may be a LED driver configured to power a LED, a laser driver configured to power a laser (e.g., VCSEL), or a LED/laser driver configured to power either a LED or laser. Thus, in some examples, a laser driver may be a type of LED driver.

The LED/VCSEL 125 may, in various examples, be configured to generate an optical signal based on the output of the LED/laser driver 120. Specifically, the LED/VCSEL 125 may generate an optical signal based on ITX. The optical signal may be transmitted across an optical channel and received by the photodiode 125. In some examples, the optical signal may be reflected off of a surface, and the reflection of the optical signal may be received by the photodiode 125. The photodiode 125 may be configured to receive the optical signal, and convert the optical signal into an electrical current (e.g., photodiode current (IPD)). IPD may be amplified, via photo sensing amplifier 130, and provided to data acquisition logic 115. In various examples, data acquisition logic 115 may be configured to extract data from and/or convert IPD into a data signal. For example, data acquisition logic 115 may be configured to sample the amplified signal from photo sensing amplifier 130, and generate a digital signal based on the sampled optical signal (e.g., representing the optical signal). In some examples, slew rate control logic 110 may further be configured to adjust a slew rate of ITX based on the received signal.

In various embodiments, the slew rate of ITX may be controlled via slew rate control logic 110. Specifically, a digital programmable slew rate control scheme may be implemented via slew rate control logic 110. In various embodiments, a slew rate control scheme may be implemented via a digital ramp generator. In some examples, the digital ramp generator may include a delay line, oscillator, selector, and/or oscillator control circuitry. As an example, a digital ramp generator produces a continuously ascending or descending output signal. It can be used to create a variety of waveforms, including sawtooth, triangle, and square waves. The rate at which the output signal changes (e.g., the slope of the ramp) can be controlled by adjusting the time delay between successive output steps. The delay line includes a series of one or more delay elements and may be used to control the output of a current-mode digital to analog converter (DAC) (e.g., generate timing for the output of a transmit current ramp). The output of the DAC may be a reference signal from which the LED/laser driver 130 may generate ITX. Accordingly, the digital ramp generator may be configured to control a slew rate of the reference signal, and in turn, the drive current (e.g., ITX) as output by the driver.

In various embodiments, a delay element includes a circuit or component configured to cause a delay in a signal, such as a clock signal. A delay line may be a series of interconnected delay elements. Delay elements may include, without limitation, digital delay elements, programmable delay elements, flip-flops (e.g., D-type flip flops, etc.), latches, or other types of delay elements. Suitable delay elements may include various types of delay elements capable of being clocked (e.g., having an output controlled by a clock signal). Thus, clocking refers to control of the output of the delay element (e.g., a flip flop) by a clock input. Thus, an output may be enabled by the clock signal (e.g., input D of a D-type flip flop is caused to be output by a rising edge of a clock signal). The operation of the slew rate control architecture is described in greater detail below with respect to FIG. 2.

Figure 2:
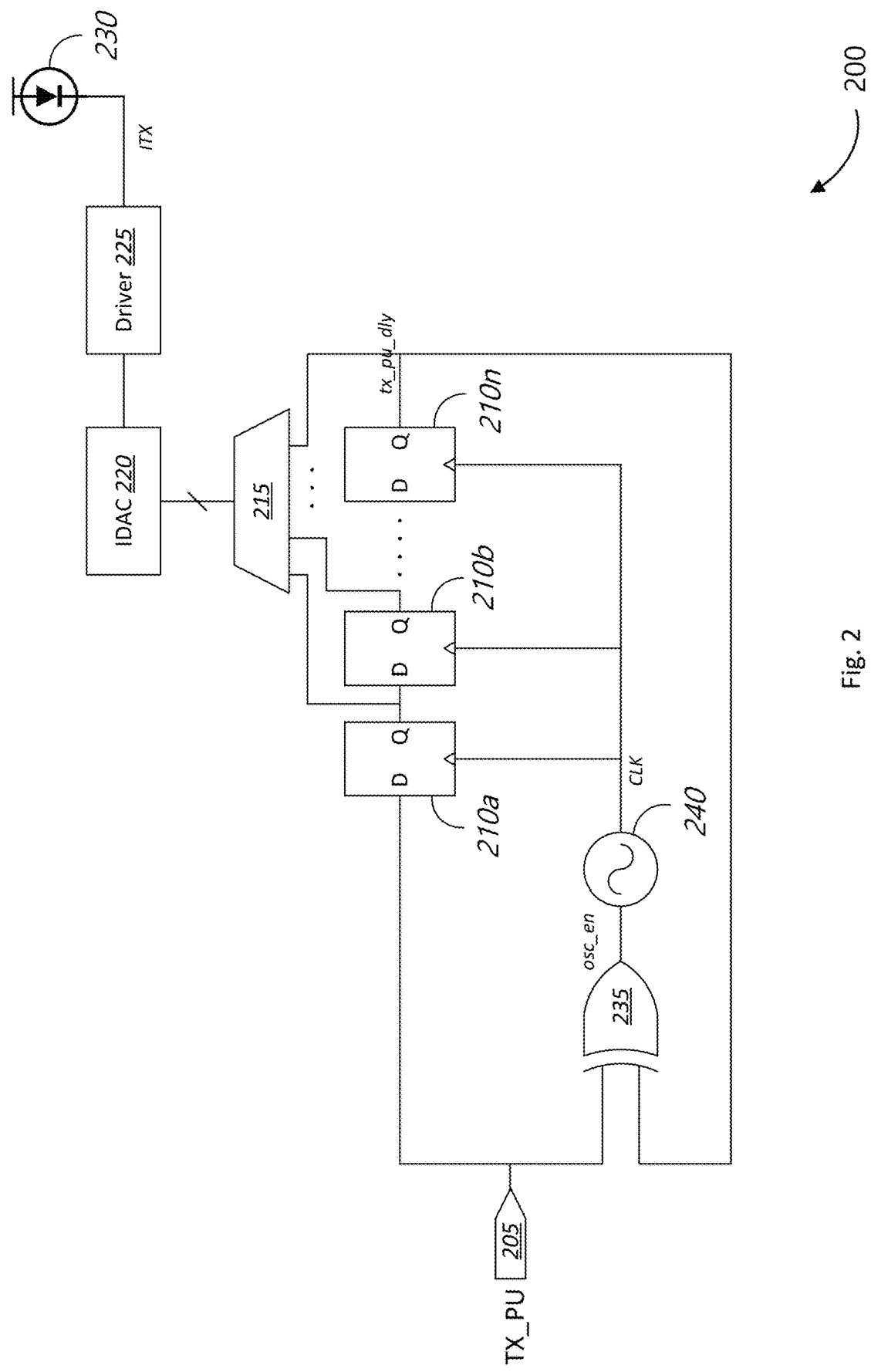
FIG. 2 is a schematic diagram of a slew control architecture, in accordance with various embodiments.

FIG. 2 is a schematic diagram of a slew control architecture 200. The architecture 200 includes TX_PU input 205, one or more delay elements 210a-210n (collectively, "delay line 210" or "delay elements 210"), selector 215, current-mode DAC (IDAC) 220, driver 225, LED 230, exclusive or (XOR) gate 235, and oscillator 240. It should be noted that the various components of the architecture 200 are schematically illustrated in FIG. 2, and that modifications to the various components and other arrangements of the architecture 200 may be possible and in accordance with the various embodiments.

In various examples, the architecture 200 is a circuit architecture for a slew rate control circuit. In operation, the architecture may include a series of one or more delay elements 210a-210n configured to receive pulse control signal, TX_PU. The outputs of the delay elements are coupled to selector 215, which is configured to output a digital code to the IDAC 220. For example, the digital code comprises a series of bits to indicate the current output level of the IDAC 220, the series of bits corresponds to outputs of the delay elements (e.g., flip-flop circuits acting as a ripple counter). The IDAC 220 may then generate a reference signal having a slew rate as controlled by the architecture 200. The reference signal is provided to the driver 225, which may then generate the pulse current (e.g., drive current), ITX, from the reference signal.

In the examples below, it is to be understood that whether a signal is asserted or disabled is not limited to a particular logic level, and the association of an asserted signal to logic high is used for purposes of explanation only, and to illustrate the relationship between the signals in the slew control architecture 200.

In various embodiments, the TX_PU may be a control signal that is asserted to cause the LED 230 to be enabled (e.g., activated). Accordingly, asserted, as used herein, means that a signal is set to a logic level (e.g., logic high or logic low) that is associated with the signal being active (e.g., enabled). In some examples, TX_PU may be asserted by being set to logic high from a logic low state. As TX_PU is asserted, the one or more delay elements 210a-210n may sequentially output a delayed TX_PU signal, referred to as "tx_pu_dly." Specifically, TX_PU may be received at a first delay element 210a of the one or more delay elements 210a-210n. Each of the delay elements 210a-210n may be controlled (e.g., enabled) via a clock signal from the oscillator 240. In various examples, the one or more delay elements 210a-210n may be digital delay elements (e.g., delay flip-flops) which may change the state of its output signal (Q) to the input state (D) (e.g., state of the input signal) on a rising edge of the clock signal (CLK) at its clock input. Thus, when TX_PU is asserted (e.g., logic high), the first delay element 210a may flip its output Q to a logic high on a first rising edge of the clock signal, CLK. The output of the first delay element 210a may be coupled to input of selector 215 as well as an input D of a second delay element 210b. On a subsequent rising edge of CLK, the second flip flop 210b may change its output Q to logic high. For example, the durations of clock signals are consistent (e.g., the duration of a first clock signal is unchanged relative to the duration of a second clock signal). Thus, at each clock cycle of CLK (e.g., at each successive rising edge), a subsequent delay element may flip its output to logic high corresponding to the assertion of TX_PU. Thus, an n-th delay element may change its output Q to logic high at the n-th rising edge of CLK. Thus, the total delay of tx_pu_dly is approximately equal to the number of elements n times the period of a clock cycle of CLK (e.g., 1/frequency of CLK), not accounting for propagation and processing delay, and other factors affecting delay of the signal. For example, n delay elements together function as a counter whose count is based on the number clock cycles corresponding to an enabled (e.g., logic high) state of the TX_PU signal. When TX_PU is no longer asserted (e.g., logic low), the output at each of the delay elements 210a-210n may similarly be changed to a logic low in sequential fashion in response to successive rising edges of CLK (e.g., successive clock cycles of CLK).

The oscillator 240 may be activated while an oscillator enable signal (osc_en) is enabled (e.g., asserted). In various examples, osc_en is output by the XOR gate 235. The XOR gate 235 may take, as its inputs, TX_PU and tx_pu_dly (e.g., the output of the n-th delay element 210n). Thus, osc_en may be asserted (e.g., the output of the XOR gate 235 is logic high) when the states of TX_PU and tx_pu_dly are not the same. For example, osc_en may be asserted while TX_PU is logic high and tx_pu_dly is logic low. In other words, the state of osc_en may be given by: osc_en=TX_PU⊕tx_pu_dly. In some embodiments, the XOR gate may be implemented using other logic gates, so long as the oscillator is only enabled while TX_PU and tx_pu_dly are mismatched.

As the states of the one or more delay elements 210a-210n changes from low to high, when both TX_PU and tx_pu_dly are in the same state (e.g., the output of the n-th delay element transitions to a logic high), osc_en may be disabled (e.g., set to logic low). When TX_PU is then disabled (e.g., no longer asserted) and set to logic low, the tx_pu_dly and TX_PU may once again be in different states (e.g., tx_pu_dly is still logic high while TX_PU is logic low). Thus, while TX_PU and tx_pu_dly are not in mismatched states, osc_en may be enabled (e.g., asserted). When the output of the n-th delay element changes to logic low, tx_pu_dly and TX_PU may both be in logic low states, and osc_en may be disabled (e.g., set to logic low). It is to be understood that in other examples, an asserted signal may be associated with a logic low state, and a disabled signal associated with a logic high state.

In various examples, the oscillator 240 may be a relaxation oscillator, configured to have a stable output frequency from the first cycle with zero start-up delay. In other embodiments, the oscillator 240 may include a clock source exhibiting low phase noise, low jitter, and insensitivity to power supply variations (e.g., supply voltage, etc.). For example, other suitable oscillators 240 may include, without limitation, a crystal oscillator.

In various examples, the oscillator 240 may be configured to enter a standby state while osc_en is disabled. In the standby state, the oscillator 240 may set internal nodes to initial voltages (e.g., Vp and Vn) and a comparator of the oscillator set to active mode with correct direct current (DC) operating point. A comparator bias control may further be used to reduce current in the standby state. The architecture and operation of the oscillator 240 is described in greater detail below with respect to FIG. 4.

The outputs of the one or more delay elements 210a-210n may be output in parallel to the selector 215, which may code the parallel outputs into a serialized digital code. As used herein, a selector 215 is an electronic component (such as a multiplexer, or one or more multiplexers) configured to select between one or more inputs to generate an output (e.g., forward a selected input as an output). In some examples, selector 215 may include a multiplexer (or one or more multiplexers) configured to map delay element outputs (e.g., the outputs of the one or more delay elements 210a-210n) to one or more IDAC inputs (e.g., digital codes). For example, in some embodiments, each delay element output may correspond to a respective bit of a digital code. In this example, the ITX (or reference signal generated by the IDAC) may have increase/decrease in a discrete number of steps that is equal to the number of delay elements (e.g., digital code bits). In other embodiments, a single delay element output may correspond to multiple bits of the digital code. In this way, the IDX and/or reference signal generated by the IDAC may be configured to have a faster slew rate with a fewer number of steps. In some further examples, the selector 215 may include a serializer, configured to take a parallel input (e.g., the delay element outputs) and generate a serialized output (e.g., digital code).

The IDAC 220 may be a current-mode DAC configured to output a current based on the value of the digital code. Accordingly, in some examples, the IDAC 220 may include a thermometer-coded DAC.

In various embodiments, when TX_PU is asserted, during a first clock cycle of CLK (e.g., at the first rising edge of CLK), the output of the digital code may be a first value. For example, when four delay elements are used, the delay elements may, during a first clock cycle, output parallel outputs 1, 0, 0, 0 (e.g., a first delay element 210a outputs logic high "1," a second delay element 210b outputs a logic low "0," a third delay element 210c outputs 0, and a fourth delay element 210d outputs 0). The selector 215 may then generate a digital code 0001, based on the outputs of the delay elements 210. During a second clock cycle (e.g., at a second rising edge of CLK), the delay elements 210 may output 1, 1, 0, 0. The selector 215 may then generate a digital code 0011 based on the outputs of the delay elements. This may continue for subsequent clock cycles until TX_PU and tx_pu_dly enter the same state (e.g., both logic high), and the oscillator 240 becomes disabled.

At the IDAC 220, each digital code may correspond to a respective output current. Thus, at a first digital code of 0001, a first output current may be output by the IDAC. At a second digital code of 0011, a second output current may be output. In some examples, a larger digital code may correspond to a greater output current. In this way, at each clock cycle, the digital code may be increased, causing IDAC 220 to generate a digital ramp signal. When osc_en is disabled, a current level output by the IDAC 220 may be maintained. When TX_PU is disabled, osc_en may again be asserted, causing oscillator 240 to become activated.

Like the ramp-up operation, the delay elements 210a-210d may sequentially ramp down. Thus, when TX_PU is disabled, during a first rising edge of CLK (e.g., first clock cycle) the outputs of the delay elements may be 0, 1, 1, 1; 0, 0, 1, 1 during a second clock cycle; 0, 0, 0, 1 during a third clock cycle; and 0, 0, 0, 0 during a fourth clock cycle. The respective outputs at each clock cycle may be serialized via the selector 215 and output to IDAC 220 to generate digital ramp signal, in which the output of the IDAC 220 is ramped down Accordingly, in various embodiments, the slew rate of the reference signal, and in turn ITX, is controlled via the one or more delay elements 210a-210n, as well as a clock frequency of CLK (e.g., oscillation frequency of the oscillator 240). Specifically, the number of delay elements may correspond to the number of steps (e.g., digital codes) for which IDAC 220 may generate respective output current levels. Thus, the number of steps may correspond to the number of steps in the ramp of the reference signals. The number of steps in the ramp may thus be controlled by adding or removing delay elements. Moreover, when more steps (e.g., delay elements) are present, the ramp signal may increase more slowly (e.g., more clock cycles to reach a final output current level).

Furthermore, the clock frequency of CLK may determine the rate at which new digital codes are output to the IDAC 220. In other words, when the clock frequency is higher, less time is spent at a respective digital code (e.g., output current level), and the faster the ramp (e.g., output current level) will increase (or decrease). Correspondingly, the slower the clock frequency, the slower the ramp will increase (or decrease).

In this way, the slew rate of the reference signal, and in turn ITX, may be controlled by the total number of delay elements and/or clock frequency (e.g., oscillation frequency).

In various embodiments, the output of the IDAC 220 may be a reference signal from which driver 225 generates ITX. Driver 225 may be a LED driver and/or laser driver as previously described. In some examples, the driver 225 may be configured to drive the reference signal at a constant current and/or voltage. Thus, ITX may be the reference signal provided by driver 225 with a constant power (e.g., current) to the LED 230. Similarly, as previously described, LED 230 may include a laser diode, such as VCSEL.

Figure 3:
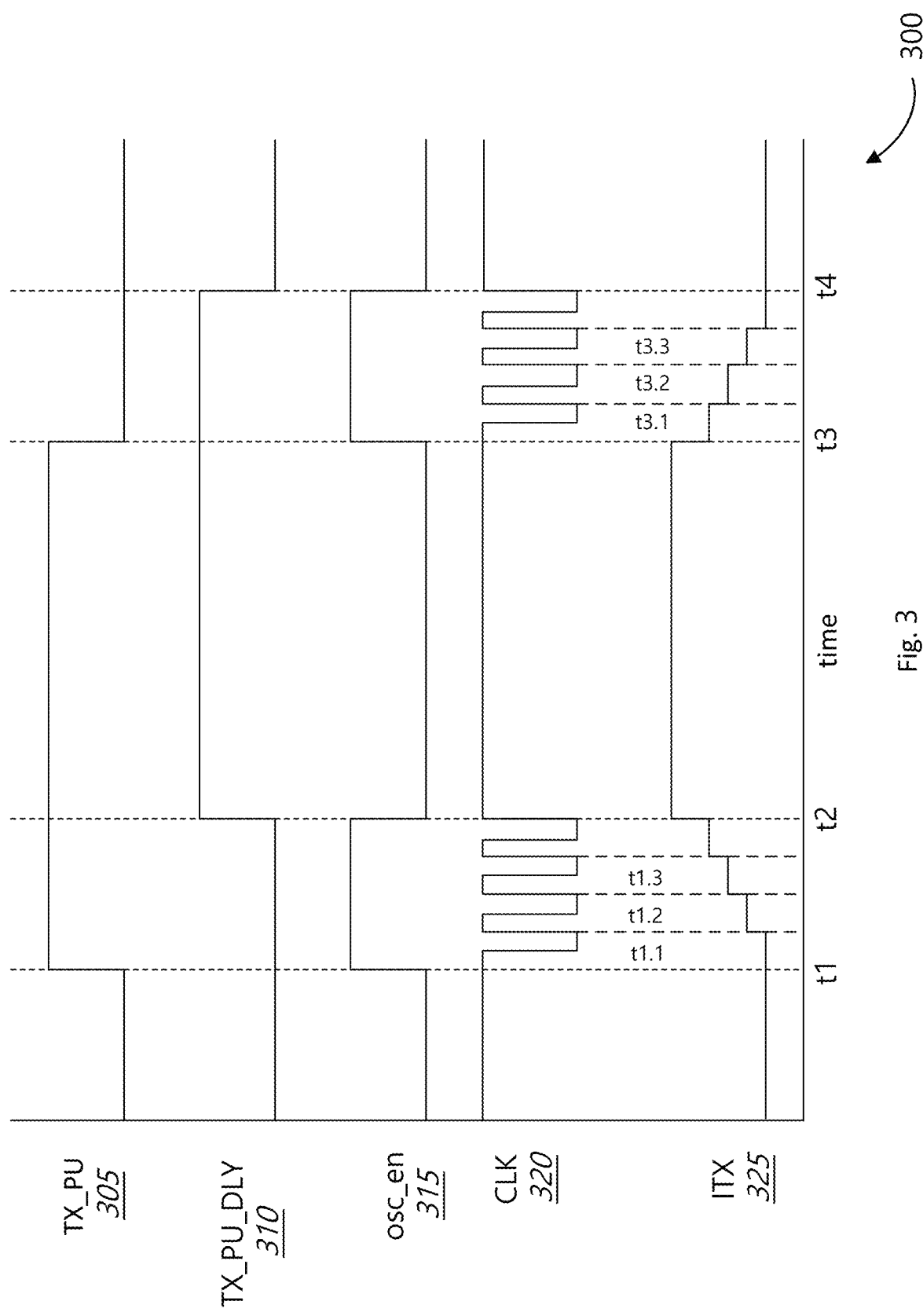
FIG. 3 is a timing diagram illustrating various signals in the slew control architecture, in accordance with various embodiments.

FIG. 3 is a timing diagram 300 illustrating various signals in the slew control architecture, in accordance with various embodiments. As previously described with respect to FIG. 2, the various signals of the architecture 200 are illustrated in relation to each other. In the illustrated example, TX_PU 305 is asserted at a first time (t1). TX_PU_DLY 310 is asserted after a delay of n-delay elements, in this example 4 delay elements, at a second time (t2). As shown in the timing diagram, osc_en 315 is asserted concurrently with TX_PU 305 at t1 (under ideal conditions, not including propagation, processing, and other delays). CLK 320 may then be activated, with a first falling edge occurring at t1.1, a first rising edge at the start of t1.2, and a second rising edge at t1.3. In various examples, the first falling edge of the clock signal follow TX_PU. Specifically, startup of the oscillator from a standby state may be such that start-up delay is reduced (or in some instances minimized) and delay uncertainty mitigated. Thus, in some examples, a delay between TX_PU assertion and the first rising edge of CLK 320 may have a duration that is consistent or maintained between successive (e.g., subsequent) TX_PU assertions. Similarly, when TX_PU is disabled (e.g., no longer asserted), the delay between the falling edge of TX_PU and a subsequent "first rising edge" of CLK 320 (e.g., after it has been asserted again), may similarly have a duration that is consistent with TX_PU assertion, and when TX_PU is subsequently disabled.

At each rising edge of CLK 320, a new digital code may be output to the IDAC, and in turn, the LED/laser driver to generate ITX 325. Thus, at t1, the digital code may be 0000, corresponding to a 0 current level. At t1.1, a first digital code may be generated, corresponding to a first output current. In some examples, the first digital code may be 0001 and correspond to a first output current that is lower than a second output current. This is shown in ITX 325, where the output current ramps up to the first output current from a baseline or 0 current level. At t1.2, a second digital code may be generated corresponding to a second output current, such as 0011. The second output current may have a current level that is greater than the first output current, thus resulting in an increase in the output current of ITX 325. At t1.3, a third digital code may be generated corresponding to a third output current greater than the second output current. In this way, a ramp (e.g., a digital ramp) may be generated in ITX 325.

When TX_PU_DLY 310 is asserted concurrently with TX_PU 305 at time t2, osc_en 315 may be disabled. When TX_PU is disabled, at time t3, osc_en 315 may be enabled (e.g., asserted). This may cause CLK 320 to become active again, with a first falling edge occurring at time t3.1, a first rising edge at time 3.2, and a second rising edge at time 3.3. Like the ramp-up operation, ITX 325 may similarly be caused to ramp down based on the generation of digital codes in descending order. For example, at the beginning of t3.1 (e.g., around the time TX_PU switches from high to low), the digital code may decrease, at the first rising edge at t3.2 decrease again, and so on at the second and third rising edges. In this way, an output current may be decreased corresponding to the respective digital codes. In some embodiments, the output currents during ramp down operation (e.g., when TX_PU is disabled) may correspond to the same output current levels during ramp-up operation (e.g., when TX_PU is asserted). For example, an output current at digital code generated at the third rising edge at t1.3 may correspond to the same output current at the digital code generated at the first rising edge at t3.1 (e.g., digital code 0111 may correspond to an output current at the same level as digital code 1110), and so on for each respective ramp level. In other examples, each digital code may correspond to a different respective output current level.

Figure 4:
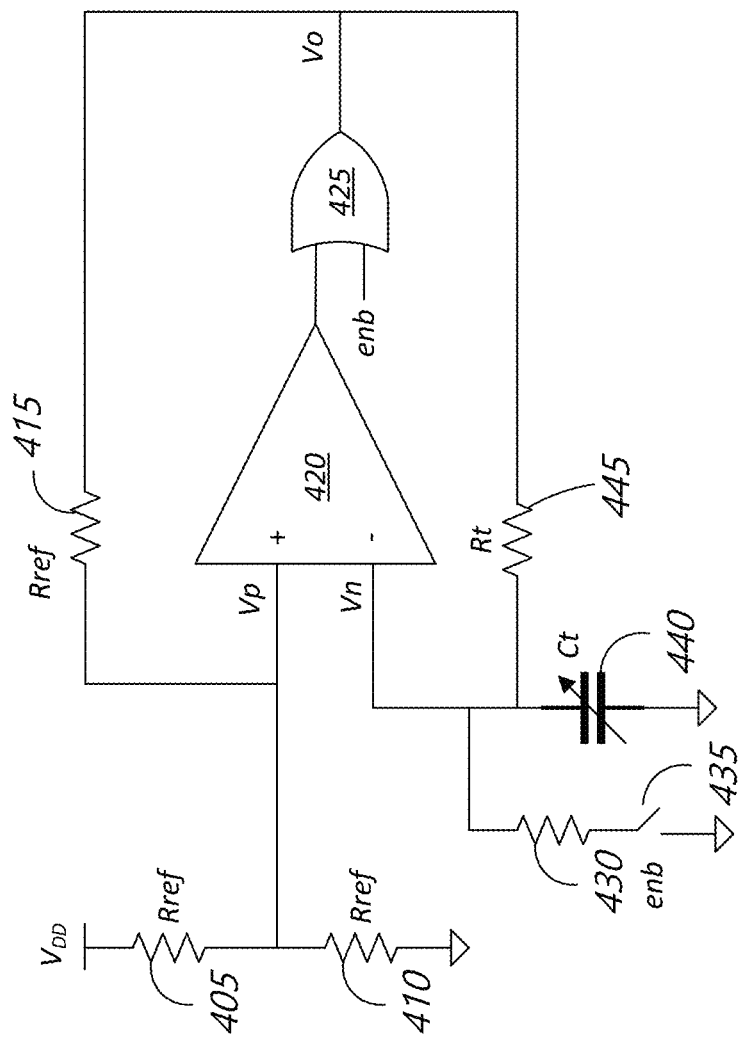
FIG. 4 is a schematic diagram of an oscillator circuit, in accordance with various embodiments.

FIG. 4 is a schematic diagram of an oscillator circuit 400, in accordance with various embodiments. The oscillator circuit 400 includes a first resistor 405, second resistor 410, third resistor 415, comparator 420, OR gate 425, fourth resistor 430, switch 435, capacitor 440, and fifth resistor 445. It should be noted that the various components of the oscillator circuit 400 are schematically illustrated in FIG. 4, and that modifications to the various components and other arrangements of the circuit 400 may be possible and in accordance with the various embodiments.

As previously described, the oscillator circuit 400 may be a relaxation oscillator design. A voltage applied to the non-inverting input of the comparator (Vp) may be controlled such that a voltage that is either ⅓ or ⅔ of a supply voltage ($V_{DD}$) is applied, depending on the state of the comparator output voltage (Vo). The resistances of the first resistor 405 and second resistor 410 may be set accordingly. The initial value of the non-inverting input (Vn) may be set such that a voltage of ⅓ $V_{DD}$ is applied. Specifically, OR gate 425 forces Vo to be high when osc_en is de-asserted (enb=1) and sets Vp to ⅔ of Vdd.

When osc_en is asserted, the switch 435 may be opened (e.g., disconnected), and the capacitor 440 may begin to charge, causing Vn to increase to the ⅔ $V_{DD}$ level of Vp. Once the two inputs become equal, the output of the comparator may switch its output Vo to 0, and cause capacitor 440 to discharge slowly through the fifth resistor 445, Vp to fall ⅓ $V_{DD}$, and Vn to slowly fall as capacitor 440 discharged. Once Vn falls to ⅓ $V_{DD}$, the comparator 420 may once again output high (e.g., Vo is set to output a logic high). As a result, Vp may once again be set to ⅔ $V_{DD}$, and Vn slowly increase as capacitor 440 becomes charged. In this way, a clock signal may be generated having an oscillation frequency ($f_{osc}$) that is determined based on the capacitance of capacitor 440 and resistance of the fifth resistor 445. Specifically, $f_{osc}$ may be given as:

$$f_{osc} = \frac{1}{2 * \ln 2 * RC}.$$

Thus, with the relaxation oscillator circuit 400, oscillation frequency is independent of $V_{DD}$ (e.g., insensitive to changes or noise in $V_{DD}$).

When osc_en is disabled, the oscillator circuit 400 may enter a standby state, in which the switch 435 may be closed (e.g., connected), discharging capacitor 440 (e.g., via the fourth resistor 430), and input nodes Vp and Vn reset to appropriate initial values (e.g., ⅔ $V_{DD}$ and ⅓ $V_{DD}$, respectively). In some examples, a switchable aux resistor ladder and comparator bias control (not shown) may further be used to reduce current in the standby state. In this way, the oscillator 400 may be driven by the TX_PU, and synchronized to the assertion of TX_PU and to the disabling of TX_PU (e.g., when TX_PU is set to logic low from logic high).

Figure 5:
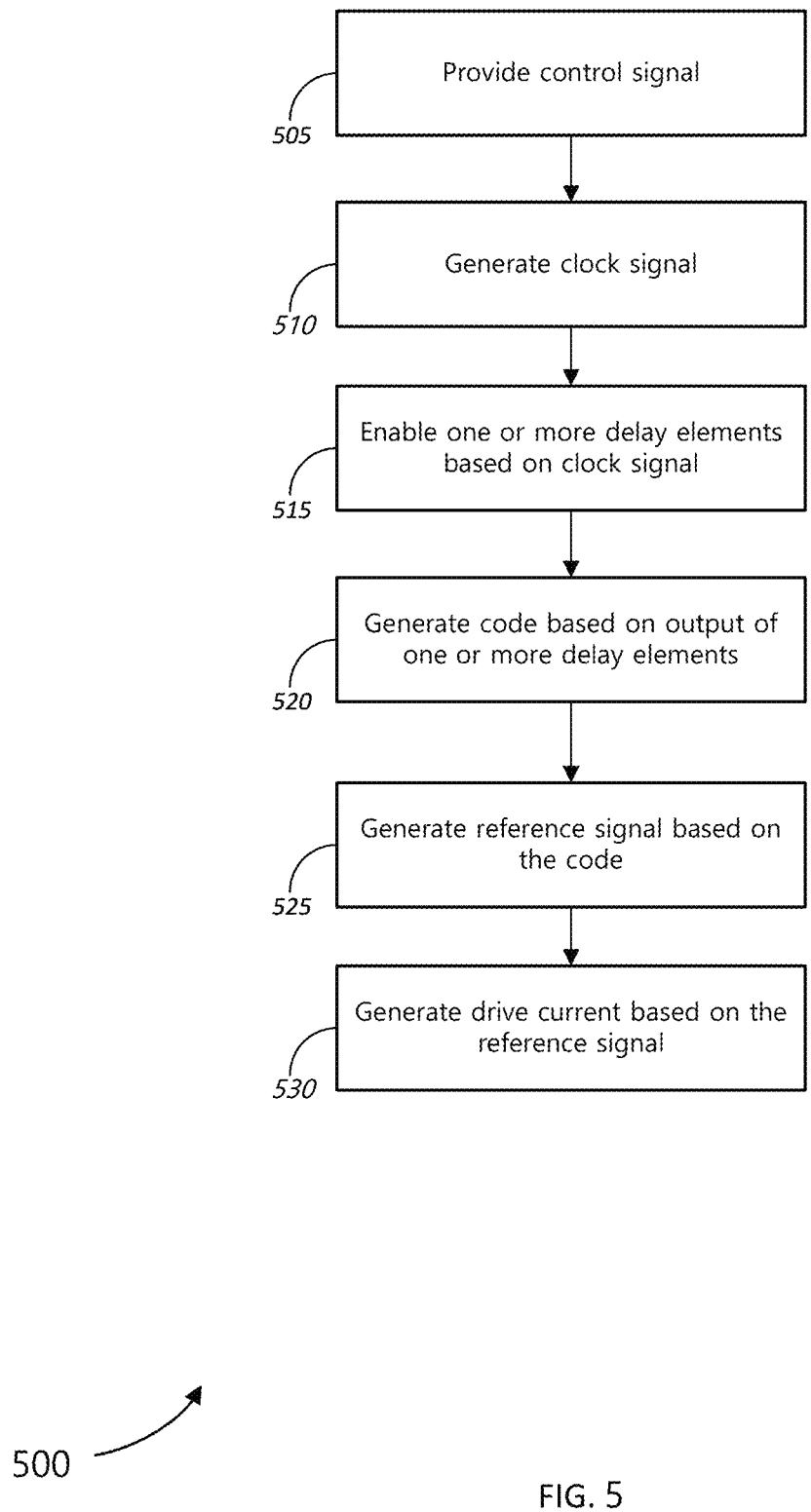
FIG. 5 is a flow diagram of a method of implementing slew rate control, in accordance with various embodiments.

FIG. 5 is a flow diagram of a method 500 of implementing slew rate control. The method 500 includes, at block 505, providing a control signal. As previously described, a pulse control signal, TX_PU, may be asserted to activate and/or generate an optical signal via a LED or VCSEL. In various examples, the control signal (e.g., TX_PU) may be received by an input of a delay element of a delay line. The delay line may include one or more delay elements. TX_PU may further be provided to an oscillator and/or oscillator control circuitry (e.g., XOR gate) as previously described to enable the oscillator.

At block 510, the method 500 may continue by generating a clock signal. As previously described, the clock signal may be configured to clock the one or more delay elements of the delay line. The clock signal may be generated by an oscillator as previously described. In various embodiments, an oscillator enable signal, osc_en, is generated based on TX_PU. Specifically, a XOR gate may be configured to receive, as its inputs, TX_PU and a TX_PU_DLY. TX_PU_DLY may be a delayed control signal TX_PU output by the last delay element of the delay line. Accordingly, while TX_PU and TX_PU_DLY are not the same logic level, the oscillator may be enabled and a clock signal generated.

At block 515, the method continues by enabling the one or more delay elements based on the clock signal. As previously described, the one or more delay elements of the delay line may be clocked by the clock signal generated by the oscillator. When clocked by the clock signal, a delay element may be enabled on a rising edge of the clock signal. Specifically, when enabled by the clock signal, an output of the delay element may be changed (or maintained) to match an input signal. For example, in some embodiments, the delay element may be a digital flip flop. Thus, an output of the flip flop may be changed to match the input (e.g., a D input) to the flip flop on a rising edge of the clock signal. When the signal at the input of the flip flop is changed, the previous output is maintained until the next rising edge of the clock signal. The output may therefore change to match the input on a subsequent rising edge of the clock signal. In this way, the TX_PU may be delayed by the delay line based on the total number of delay elements and a clock frequency of the clock signal.

At block 520, the method 500 continues by generating a code based on the respective outputs of the one or more delay elements. As previously described, in some examples, the outputs of each of the one or more delay elements may be provided, in parallel, to a selector. The selector may be configured to take the parallel outputs of the respective one or more delay elements and generate a serial code as output. As the outputs of the one or more delay elements changes with each clock cycle, the selector may be configured to generate a new code based on the changed or updated outputs for the current clock cycle. In this way, one or more codes may be generated and updated based on the outputs of the one or more delay elements.

At block 525, the method 500 continues by generating a reference signal based on the code. As previously described, the code generated by the selector may be provided to a DAC. The DAC may be a current-mode DAC (e.g., IDAC) configured to output a current based on the digital code. Specifically, the IDAC may be configured to generate a reference signal having an output current level corresponding to a respective code. For example, a first code may correspond to a first current level that is less than a second current level. A second code may correspond to a second current level that is less than a third current level, and so on. Accordingly, the reference signal, in various examples, is a ramp signal that increases in discrete steps (e.g., a digital ramp signal), and generated via the IDAC based on the generated codes. The slew rate of the ramp may be determined based on the total number of delay elements and/or a frequency of the clock signal.

At block 530, the method 500 further includes generating a drive current based on the reference signal. As previously described, the reference signal may be provided to a LED and/or laser driver to generate a drive current, the drive current being configured to drive a LED and/or VCSEL. In some examples, the drive current may be generated based on the reference signal by the driver. In further examples, the drive current may be the reference signal provided to the LED and/or VCSEL that is voltage and/or current regulated (e.g., constant voltage and/or constant current) by the LED and/or laser driver. As an example, the slew rate (both ramping up and down) of the drive current corresponds to the reference signal. Depending on the implementation, the magnitude of the drive current may be directly proportional and multiple times higher than the magnitude of the reference signal.

While some features and aspects have been described with respect to the embodiments, one skilled in the art will recognize that numerous modifications are possible. For example, the methods and processes described herein may be implemented using hardware components, custom integrated circuits (ICs), programmable logic, and/or any combination thereof. Further, while various methods and processes described herein may be described with respect to particular structural and/or functional components for ease of description, methods provided by various embodiments are not limited to any particular structural and/or functional architecture but instead can be implemented in any suitable hardware configuration. Similarly, while some functionality is ascribed to one or more system components, unless the context dictates otherwise, this functionality can be distributed among various other system components in accordance with the several embodiments.

Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. An apparatus comprising:
a digital ramp generator comprising a delay line, the delay line comprising one or more delay elements and an oscillator, wherein the one or more delay elements are configured to be clocked by a clock signal generated by the oscillator, wherein a first delay element of the one or more delay elements is configured to receive a control signal as input, wherein the oscillator is enabled by the control signal, wherein the digital ramp generator is configured to generate a code based on respective outputs of the one or more delay elements;
a digital to analog converter (DAC) coupled to the digital ramp generator, wherein the DAC is configured to generate a reference signal, the reference signal is generated based, at least in part, on the code; and
a driver coupled to the DAC, the driver configured to generate a drive current based, at least in part, on the reference signal;
wherein the oscillator comprises a capacitor and an oscillation frequency of the oscillator is independent of a supply voltage, and determined based at least in part, on a capacitance of the capacitor.

2. The apparatus of claim 1, wherein the oscillator is a relaxation oscillator.

3. The apparatus of claim 2, wherein a first delay between a first rising edge of the clock signal and a rising edge of the control signal has a first duration, wherein the first delay is consistent with a second delay between a falling edge of the control signal and a subsequent first rising edge of the clock signal enabled after the falling edge of the control signal.

4. The apparatus of claim 1, wherein the one or more delay elements are digital delay elements.

5. The apparatus of claim 4, wherein the digital delay elements include digital flip flops.

6. The apparatus of claim 1, wherein the digital ramp generator is configured to control a slew rate of the reference signal, wherein the slew rate of the reference signal is determined based, at least in part, on a total number of delay elements of the one or more delay elements.

7. The apparatus of claim 1, wherein the digital ramp generator is configured to control a slew rate of the reference signal, wherein the slew rate of the reference signal is determined based, at least in part, on a frequency of the clock signal.

8. A circuit comprising:
one or more delay elements, each delay element of the one or more delay elements clocked via a clock signal, wherein a first delay element of the one or more delay elements is configured to receive a control signal as input, and wherein a second delay element of the one or more delay elements is configured to output a delayed control signal, the control signal comprising a first rising edge, the delayed control signal comprising a second rising edge, the second rising edge being later than the first rising edge;
an oscillator configured to generate the clock signal, wherein the oscillator is configured to generate the clock signal in response to an enable signal;
an exclusive or (XOR) gate configured to output the enable signal, wherein a first input of the XOR gate is coupled to the control signal, and a second input of the XOR gate is coupled to the delayed control signal, wherein the enable signal is generated by a XOR of the first and second inputs; and
a selector coupled to the one or more delay elements, the selector configured to provide a code based on the outputs of the one or more delay elements.

9. The circuit of claim 8, further comprising a digital to analog converter (DAC), wherein the DAC is coupled to the selector and configured to generate a reference signal, wherein an electrical current of the reference signal is determined based, at least in part, on the code.

10. The circuit of claim 9, further comprising a driver, wherein the driver is coupled to the DAC and configured to generate a drive current based, at least in part, on the reference signal.

11. The circuit of claim 10, wherein a slew rate of the reference signal is determined based, at least in part, on a total number of delay elements of the one or more delay elements and a frequency of the clock signal.

12. The circuit of claim 8, wherein the oscillator is a relaxation oscillator.

13. The circuit of claim 12, wherein a first delay between a first rising edge of the clock signal and a rising edge of the control signal has a first duration, wherein the first delay is consistent with a second delay between a falling edge of the control signal and a subsequent first rising edge of the clock signal enabled after the falling edge of the control signal.

14. The circuit of claim 12, wherein the oscillator comprises a capacitor, an oscillation frequency of the oscillator is independent of a supply voltage, and determined based at least in part, on a capacitance of the capacitor, wherein a frequency of the clock signal is determined based on the oscillation frequency.

15. The circuit of claim 8, wherein the one or more delay elements comprise digital delay elements.

16. The circuit of claim 15, wherein the digital delay elements comprise flip flops.

17. A system comprising:
a controller configured to generate a control signal;
a circuit coupled to the controller, the circuit comprising:
one or more delay elements, each delay element of the one or more delay elements clocked via a clock signal, wherein a first delay element of the one or more delay elements is configured to receive the control signal as input, and wherein a second delay element of the one or more delay elements is configured to output a delayed control signal, the control signal comprising a first rising edge, the delay control signal comprising a second rising edge, the second rising edge being later than the first rising edge;
an oscillator configured to generate the clock signal, wherein the oscillator is configured to generate the clock signal in response to an enable signal;
a selector coupled to the one or more delay elements, the selector configured to generate a code based on outputs of the one or more delay elements;
a digital to analog converter (DAC) coupled to the selector, wherein the DAC is configured to generate a reference signal based, at least in part, on the code;
a driver coupled to the circuit, the driver configured to generate a drive current based, at least in part, on the reference signal; and a light emitting diode coupled to the driver, the light emitting diode configured to generate an optical signal based on the drive current.

18. The system of claim 17, wherein the circuit is configured to control a slew rate of the reference signal, wherein the slew rate of the reference signal is determined based, at least in part, on a total number of delay elements and a frequency of the clock signal.

19. The system of claim 17, wherein the oscillator is further configured to be enabled based, at least in part, on an enable signal, wherein the enable signal is generated as a function of the control signal and a delayed control signal, wherein the delayed control signal is output by a last delay element of the one or more delay elements, and wherein the function is an exclusive or (XOR); and wherein the oscillator is configured to enter a standby state when the enable signal is disabled.

* * * * *